(12) United States Patent
Lin et al.

(10) Patent No.: US 8,986,457 B2
(45) Date of Patent: Mar. 24, 2015

(54) EVAPORATION SOURCE ASSEMBLY, FILM DEPOSITION DEVICE AND FILM DEPOSITION METHOD

(71) Applicant: EverDisplay Optronics (Shanghai) Limited, Shanghai (CN)

(72) Inventors: Chinchih Lin, Shanghai (CN); Haoyu Chou, Shanghai (CN); Chunyun Huang, Shanghai (CN)

(73) Assignee: Everdisplay Optronics (Shanghai) Limited, Shanghai (CN)

( * ) Notice: Subject to any disclaimer, the term of this patent is extended or adjusted under 35 U.S.C. 154(b) by 21 days.

(21) Appl. No.: 13/954,345

(22) Filed: Jul. 30, 2013

(65) Prior Publication Data
US 2014/0295600 A1     Oct. 2, 2014

(30) Foreign Application Priority Data

Apr. 1, 2013 (CN) .......................... 2013 1 0111498

(51) Int. Cl.
*C23C 16/00* (2006.01)
*C23C 14/24* (2006.01)
*H01L 51/00* (2006.01)

(52) U.S. Cl.
CPC ............. *C23C 14/243* (2013.01); *H01L 51/001* (2013.01)
USPC ......................................... 118/726; 118/724

(58) Field of Classification Search
CPC .................................................. C23C 14/243
USPC ............................................ 438/4; 118/726
See application file for complete search history.

(56) References Cited

U.S. PATENT DOCUMENTS

| | | | |
|---|---|---|---|
| 7,815,737 B2 * | 10/2010 | Kim et al. ...................... | 118/715 |
| 2005/0257745 A1 * | 11/2005 | Abiko et al. ................... | 118/726 |
| 2006/0045958 A1 * | 3/2006 | Abiko et al. .................... | 427/66 |
| 2006/0169211 A1 * | 8/2006 | Kim et al. ...................... | 118/726 |
| 2010/0159132 A1 * | 6/2010 | Conroy et al. ............. | 427/248.1 |
| 2010/0282167 A1 * | 11/2010 | Conroy et al. ................ | 118/722 |
| 2010/0285218 A1 * | 11/2010 | Conroy et al. ............. | 427/248.1 |
| 2011/0177622 A1 * | 7/2011 | Britt et al. .......................... | 438/5 |
| 2012/0174865 A1 * | 7/2012 | Choi et al. ..................... | 118/720 |
| 2012/0285380 A1 * | 11/2012 | Dussert-Vidalet et al. ... | 118/719 |
| 2014/0010957 A1 * | 1/2014 | Inoue et al. ................ | 427/248.1 |

* cited by examiner

*Primary Examiner* — Matthew Landau
*Assistant Examiner* — Igwe U Anya
(74) *Attorney, Agent, or Firm* — Tim Tingkang Xia, Esq.; Morris, Manning & Martin, LLP (57) ABSTRACT

An evaporation source assembly used for depositing film on a substrate is provided, the evaporation source assembly comprises: a body comprising a top element, a bottom element and side walls defining a hollow chamber together, the bottom element comprises a plurality of inlet openings communicating with the chamber; a plurality of nozzles located at the top element and communicate with the chamber; a plurality of evaporators for containing and evaporating the evaporating material, which are positioned below the body and correspond to inlet openings respectively; each evaporator has an opening through which the evaporators is connected with corresponding inlet openings; and a plurality of connecting pipes for connecting the opening of the evaporators with the inlet openings, the connecting pipes are tapered pipes with a broad top and a narrow bottom to improve the vapor pressure of the evaporating material in the body to reach pressure balance.

26 Claims, 5 Drawing Sheets

EVAPORATION SOURCE ASSEMBLY, FILM DEPOSITION DEVICE AND FILM DEPOSITION METHOD

CROSS-REFERENCE TO RELATED APPLICATIONS

This application claims benefits of Chinese Patent Application No. 201310111498.4, filed on Apr. 1, 2013 in the State Intellectual Property Office of China, the disclosure of which is incorporated herein by reference in its entirety.

TECHNICAL FIELD

The present disclosure relates in general to the field of LED, in particular, to an evaporation source assembly, a film deposition device and a film deposition method for producing OLED.

BACKGROUND

Presently, OLED (organic light-emitting diode) is still produced mainly by thermal evaporation. Either manufacturer or user of the evaporation source aims at improving the performance of the evaporation source such as the improvement of the material usage, the reduction of the material cost, and the improved performance of OLED assembly, such as the uniformity of the thickness of the deposited film.

The evaporation source used in the conventional evaporation process includes a point-type evaporation source, a cluster-type linear evaporation source, a single point-type liner evaporation source and a planar evaporation source. The point-type evaporation source generally comprises a crucible for containing evaporating material, above which a substrate is located. When deposited by the point-type evaporation source, the film often presents the following disadvantages: low material utilization, generally lower than 10%; low film uniformity, generally lower than 10%, wherein the uniformity of the film is calculated by the formula: (maximum thickness−minimum thickness)/(maximum thickness+minimum thickness).

In general, the cluster-type linear evaporation source comprises at least two parallelly-arranged crucibles in the shape of an elongated recess, where the different evaporating materials are laid on the bottoms of the two crucibles, respectively. The film formed by virtue of the cluster-type linear evaporation source has good film uniformity (lower than 5%) but poor material utilization (10%-20%).

The planar evaporation source usually comprises a body which has an area equal to or larger than that of the target to be deposited. The film formed by virtue of the planar evaporation source has good material utilization (higher than 40%) but unstable film uniformity (lower than 10%).

Figure 1:
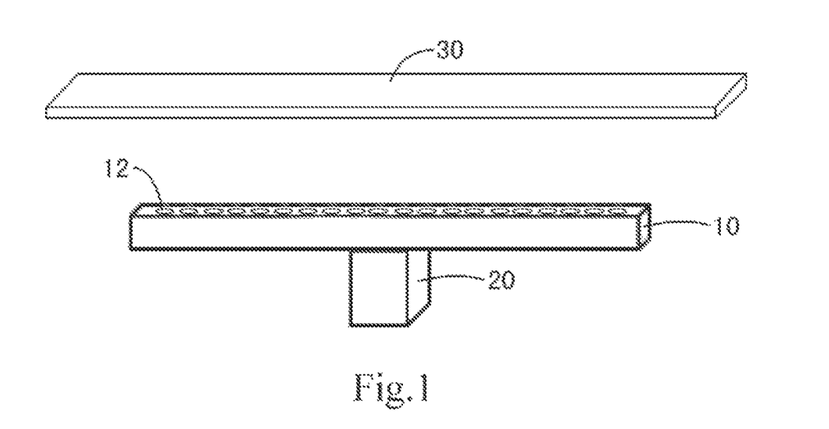
FIG. 1 illustrates a schematic of a conventional single point-liner evaporation source.

As shown in FIG. 1, the conventional single point-type liner evaporation source includes an elongated body 10 where a chamber is structured therein and a plurality of nozzles 12 is formed thereon; and a crucible 20 which is in communication with the center of the bottom of the body 10. When a film is to be deposited on a substrate 30, the crucible 20 is heated by a heating device (not shown), the evaporating material in the crucible 20 is vaporized vapor into the chamber of the body 10, and then is ejected to the substrate 30 through the nozzles 12, finally a film of the evaporating material is formed on the bottom surface of the substrate 30.

In the conventional single point-type liner evaporation source, the crucible 20 is connected to the center of the bottom of the elongated body 10, the concentration of the vaporized vapor materials in the chamber adjacent to the center of the crucible 20 is accordingly higher, while the concentration of the vaporized materials vapor far away from the center of the crucible 20 is lower. That is, the saturated pressure in the chamber is unbalanced, which causes the thickness of the film formed on the substrate 30, particularly at two ends of the substrate 30, is not uniform. Moreover, the film uniformity of a large-size film which is formed by the conventional single point-type liner evaporation source may be even worse.

The above information disclosed in this Background section is only for enhancement of understanding of the background of the disclosure and therefore it may contain information that does not form the prior art that is already known in this country to a person of ordinary skill in the art.

SUMMARY

Additional aspects and advantages will be set forth in part in the description which follows and, in part, will be apparent from the description, or may be learned by practice of the disclosure.

To solve the problem in the prior art, the disclosure discloses an evaporation source assembly, which is used to deposit a film on a substrate, the evaporation source assembly comprising:

a body which comprises a top element, a bottom element and side walls which define a hollow chamber together, wherein, the bottom element comprises a plurality of inlet openings communicating with the chamber;

a plurality of nozzles which are located at the top element and communicate with the chamber;

a plurality of evaporators for containing and evaporating the evaporating material, wherein each of which is positioned below the body and corresponds to one of the inlet openings respectively, and has an opening through which the evaporator communicates with the corresponding inlet opening; and a plurality of connecting pipes for connecting the opening of the evaporators with the inlet openings of the body, wherein, the connecting pipes are tapered pipes with a broad top and a narrow bottom so as to improve the vapor pressure of the evaporating material in the body to reach pressure balance.

According to one aspect of the disclosure, the evaporators are crucibles.

According to another aspect of the disclosure, the evaporation source assembly is a multi-point-type liner evaporation source assembly, and the body is elongated.

According to still another aspect of the disclosure, the evaporation source assembly further comprising heating devices which are provided at the bottom or surrounding of the evaporators for heating the evaporators.

According to still another aspect of the disclosure, the heating devices are independent heating devices for heating each evaporator to different temperature.

According to still another aspect of the disclosure, the evaporators at two ends of the body are heated by the heating devices to a higher temperature than that adjacent to the center of the body.

According to still another aspect of the disclosure, the heating devices are temperature compensator devices.

According to still another aspect of the disclosure, the length of the body is smaller than the length of the substrate.

According to still another aspect of the disclosure, the length of the body is ½-⅘ of the length of the substrate.

According to still another aspect of the disclosure, the nozzles are nozzle tubes which are independently formed in the top element, or through holes formed in the top element.

According to still another aspect of the disclosure, the top element and side walls are integrative or separable.

According to still another aspect of the disclosure, an angle θ between the surface of the top element and the axis of the nozzle at the center of the top element is 90°.

According to still another aspect of the disclosure, angles θ between the surface of the top element and the axes of the nozzles at two ends of the top element are smaller than 90°, and the axes of the nozzles are inclined towards corresponding end of the top element.

According to still another aspect of the disclosure, the angles θ between the surface of the top element and the axes of the nozzles gradually become smaller with the nozzles away from the center of the top element.

According to still another aspect of the disclosure, the diameters of the nozzles gradually become larger with the nozzles away from the center of the top element.

According to still another aspect of the disclosure, the arrangement densities of the nozzles gradually become larger with the nozzles away from the center of the top element.

According to still another aspect of the disclosure, the nozzle openings of the nozzles are in collinear or interlaced arrangement.

According to still another aspect of the disclosure, the body and the connecting pipes are made from galvanized iron or Titanium.

According to still another aspect of the disclosure, further comprising:
a three-way valve which has a first way communicating with the evaporators, a second way communicating with the chamber of the body, and a third way;
an exhaust pipe, wherein the third way communicate with one end of the exhaust pipe;
a gas collecting box communicating with the other end of the exhaust pipe;
wherein in the working condition of the evaporation source assembly, the first and second ways are open, and the third way is closed; in the nonworking condition of the evaporation source assembly, the first and second ways are closed, and the third way is open.

The disclosure further discloses a film deposition device, which comprises a vacuum chamber and an above-mentioned evaporation source assembly which is provided in the vacuum chamber.

The disclosure further discloses a method for depositing a film on the substrate by virtue of the evaporation source assembly above, comprising the following steps:
heating evaporators in a vacuum chamber so as to evaporate the evaporating material in the evaporators, wherein, the vapor of the evaporating material flows through the openings of the evaporators and the inlet openings of the body in turn, finally flows into the chamber of the body; and
controlling the nozzles to deposit the vapor of the evaporating material inside the chamber on the substrate above the body through the nozzles to form the film.

BRIEF DESCRIPTION OF THE DRAWINGS

The foregoing and other features and advantages of the disclosure will be apparent to those skilled in the art in view of the following detailed description, taken in conjunction with the accompanying drawings.

DETAILED DESCRIPTION

Exemplary embodiments of the disclosure will now be described more fully with reference to the accompanying drawings, in which exemplary embodiments are shown. Exemplary embodiments of the disclosure may, however, be embodied in many different forms and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and regions are exaggerated for clarity. Like reference numerals in the drawings denote like elements, and thus their description will be omitted.

The described features, structures, or/and characteristics of the disclosure may be combined in any suitable manner in one or more embodiments. In the following description, numerous specific details are disclosed to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

The First Embodiment

Figure 2:
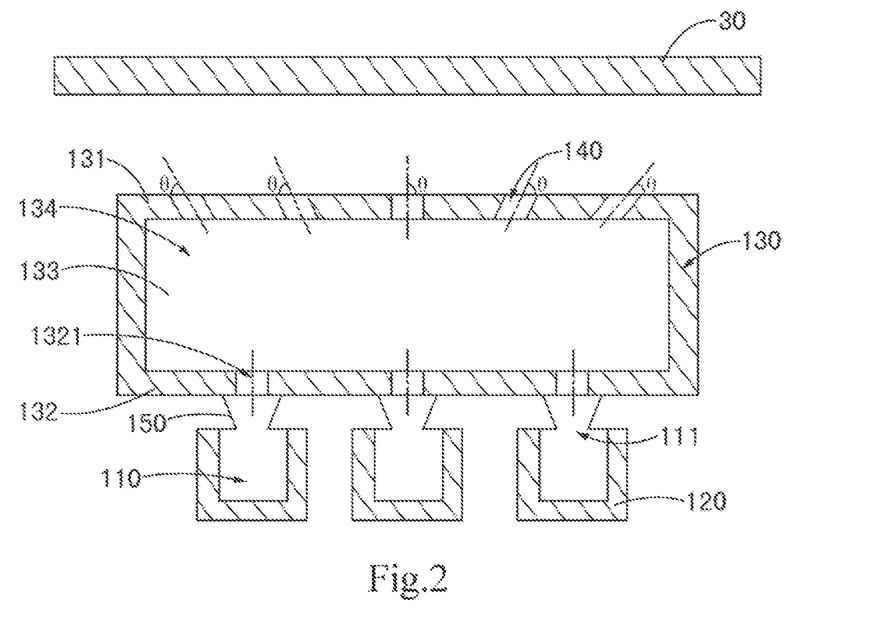
FIG. 2 illustrates a cross-sectional view of an evaporation source assembly according to the first embodiment of the disclosure.

Referring to FIG. 2, in the first embodiment, it is provided an evaporation source assembly, which is used to deposit a film on a substrate 30. The evaporation source assembly includes: a body 130 which comprises a top element 131, a bottom element 132 and side walls 133 which define a hollow chamber 134 together, wherein the bottom element 132 comprises a plurality of inlet openings 1321 communicating with the chamber 134; a plurality of nozzles 140 which are located at the top element 131 and communicate with the chamber 134; a plurality of evaporators 110 for containing and evaporating the evaporating material to be evaporated, which are positioned below the body 130 and correspond to the inlet openings 1321 respectively; each of the evaporators 110 has an opening 111 through which the evaporator 110 communicates with the corresponding inlet opening 1321; and a plurality of connecting pipes 150, one end of each of which communicates with the opening 111 of the evaporators 110, and the other end of each of which communicates with the inlet opening 1321 of the body 130. That is, the evaporators 110 and body 130 are interconnection through the connecting pipes 150. Wherein, the connecting pipes 150 are tapered pipes with a broad top and a narrow bottom, which could improve the vapor pressure of the evaporating material in the body 130 to reach pressure balance. In particular, the evaporators 110 are crucibles, in which the evaporating materials may be the same or not.

The evaporation source assembly may be a multi point-liner evaporation source assembly. The evaporation source further comprises a heating device 120 provided at the bottom or surrounding of the evaporator 110 for heating evaporating material in the evaporator 110. The heating devices 120 may be independent heating devices (such as temperature compensator devices) for heating each evaporator 110 to different temperatures. For example, the evaporators 110 at two ends of the body 130 are heated by the heating devices 120 to a higher temperature than that adjacent to the center of the body 130. The type of heating devices could be selected according to the attribute of evaporating material.

The body 130 is elongated and positioned below the substrate 30 parallelly and separately. For example, the body 130 is a hollow pipe with two ends closed. The body 130 may be made from material with high rigidity and good thermal conductivity, such as galvanized iron (SUS304) or Titanium (Ti). The top element 131 and side walls 133 may be integrative or separable. In order to reduce the overall dimension of the evaporation source assembly, the length of the body 130 may be smaller than the length of the substrate 30, such as, the length of the body 130 is ½-⅘ of the length of the substrate 30.

Figure 3:
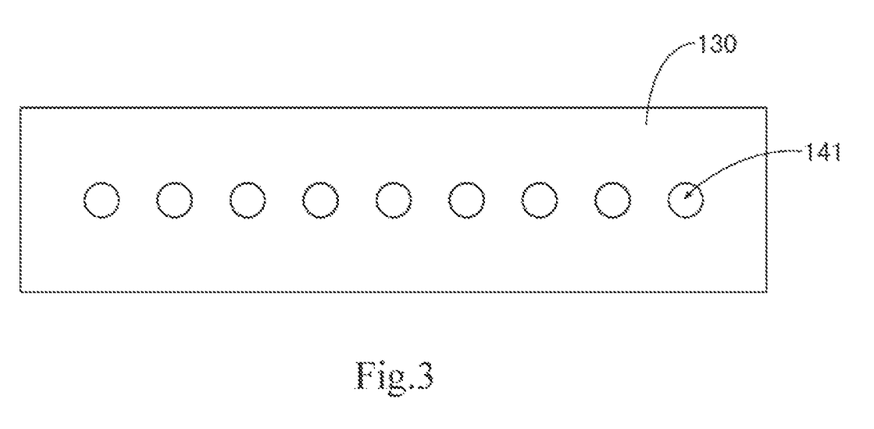
FIG. 3 illustrates a bottom view showing the arrangement of the nozzle openings of the first embodiment of the disclosure.
Figure 4:
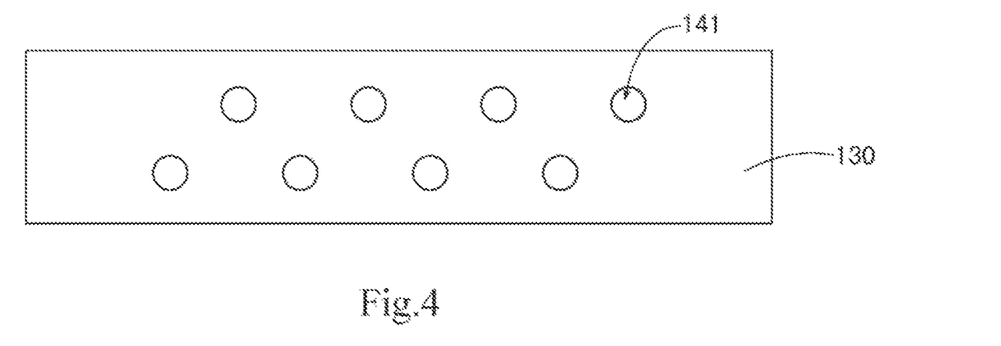
FIG. 4 illustrates a bottom view showing another arrangement of the nozzle openings of the first embodiment of the disclosure.

The nozzles 140 may be nozzle tubes which are independently formed (such as welded) in the top element 131, or may be through holes formed in the top element 131. An angle θ is existed between the axis of the nozzles 140 and the surface of the top element 131. Wherein, an angle θ between the surface of the top element 131 and the axis of the nozzle 140 at the center of the top element 131 is 90°, i.e., the axis of the nozzle 140 is perpendicular to the surface of the top element 131, therefore, the evaporating material in the chamber 134 is directly deposited at the center of the substrate 30 through the nozzle 140 at the center of the top element 131. The angles θ between the surface of the top element 131 and the axes of the nozzles 140 at two ends of the top element 131 are smaller than 90°, and the axes of the nozzles 140 are inclined towards corresponding end of the top element 131. The angles θ between the surface of the top element 131 and the axes of the nozzles 140 gradually become smaller with the nozzles 140 away from the center of the top element 131, such that the evaporating material in the chamber 134 could be deposited at two ends of the substrate 30 through the nozzles 140. In particular, the angle difference between the angle of the nozzle at the center of the top element 131 and the angle of the nozzle at two ends of the top element 131 is related with the length difference between the substrate 30 and body 130. That is, the larger the length difference is, the larger the angle difference becomes, such that the evaporating material could also be deposited at two ends of the substrate 30. Furthermore, the diameters and arrangement densities of the nozzles gradually become larger with the nozzles 140 away from the center of the top element 131, such that the uniformity for the film formed at two ends of the substrate 30 is improved. Referring to FIGS. 3 and 4, the nozzle openings 141 at the upper end of the nozzles 140 are in collinear or interlaced arrangement. That is, the line of the nozzle openings 141 is straight or zigzag, such that the vapor pressure above the nozzles 140 is more balanced.

The connecting pipes 150 are made from galvanized iron (SUS304) or Titanium (Ti). The connecting pipes 150 are detachably connected to the evaporators 110 so as to fill evaporating material into the evaporators 110.

The Second Embodiment

Figure 5:
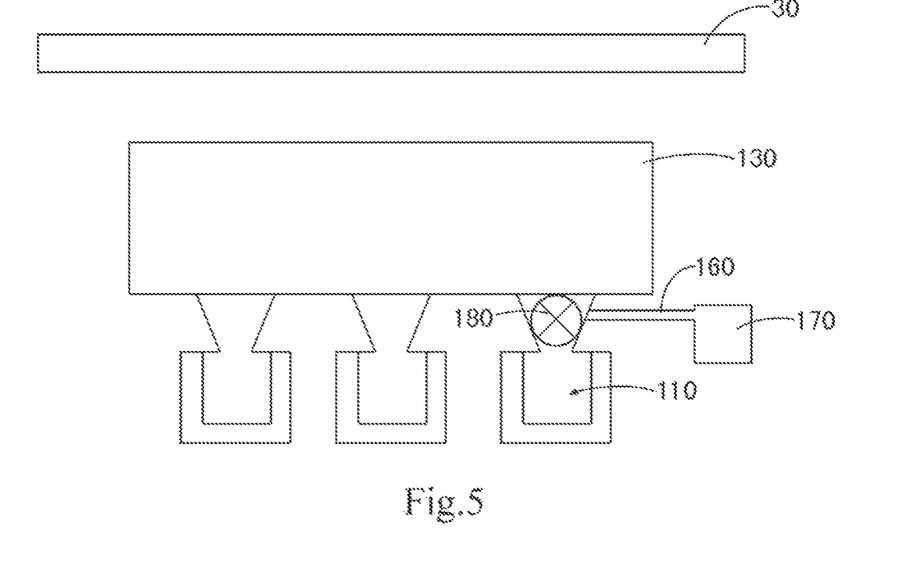
FIG. 5 illustrates a schematic of an evaporation source assembly according to the second embodiment of the disclosure.

Referring to FIG. 5, it illustrates an evaporation source assembly according to the second embodiment of the disclosure. The evaporation source assemblies according to the second embodiment and the first embodiment are basically the same except the difference as follows: the evaporation source assembly according to the second embodiment further comprises an exhaust pipe 160, a gas collecting box 170 and a three-way valve 180. The three-way valve 180 has a first way communicating with the evaporators 110, a second way communicating with the chamber 134 of the body 130, and a third way communicating with one end of the exhaust pipe 160. The other end of the exhaust pipe 160 is communicates with the gas collecting box 170. In the second embodiment, an interconnection could be established among the evaporators 110, the chamber 134 and the exhaust pipe 160 through the three-way valve 180.

In the working condition of the evaporation source assembly, the first and second ways are open, and the third way is closed, such that the vapor could flow into the chamber 134 from the evaporators 110. In the nonworking condition of the evaporation source assembly, the first and second ways are closed, and the third way is open, such that the vapor from evaporators 110 is received in the gas collecting box 170 through the exhaust pipe 160 to be recycled, which could avoid material waste.

Other parts of the second embodiment are the same as that of the first embodiment mentioned above and the detailed description is omitted herein.

In the evaporation source assembly according to the disclosure, the pressure in the chamber 134 is balanced. Moreover, the vapor ejected from each nozzle 140 has balanced density and pressure, since the nozzles 140 at two ends are inclined, such that the film formed on the substrate 30 has better uniformity. After being tested, the film uniformity is lower than ±3%. Furthermore, in the non-evaporating condition of the evaporation source assembly according to the disclosure, vapor from the chamber 134 is received in the gas collecting box 170 to be recycled, which could obtain a better material utilization, higher than 30%.

The Third Embodiment

A film deposition device is provided, which comprises a vacuum chamber and an evaporation source assembly according to the first and second embodiments provided in the vacuum chamber. By virtue of the above evaporation source assembly, the film deposition device has a material utilization higher than 30%, and a uniformity performance lower than ±3%.

The Fourth Embodiment

A deposition method is provided, which is used for depositing film on the substrate 30 by virtue of the evaporation source assembly according to the first and second embodiments. The method comprises the following steps:

heating evaporators 110 in a vacuum chamber so as to evaporate the evaporating material in the evaporators 110, the vapor of the evaporating material flows through the openings 111 of the evaporators 110 and the inlet openings 1321 of the body 130 in turn, finally flows into the chamber 134 of the body 130; and controlling the nozzles 140 to deposit the vapor of the evaporating material inside the chamber 134 on the substrate 30 above the body 130 through the nozzles 140.

It should be noted that the above embodiments are only illustrated for describing the technical solution of the disclosure and not restrictive, and although the embodiments are described in detail by referring to the aforesaid embodiments, the skilled in the art should understand that the aforesaid embodiments can be modified and portions of the technical features therein may be equally changed, which does not depart from the spirit and scope of the technical solution of the embodiments of the disclosure.

What is claimed is:

1. An evaporation source assembly, which is used to deposit a film on a substrate, the evaporation source assembly comprising:
    a body which comprises a top element, a bottom element and side walls which define a hollow chamber together, wherein, the bottom element comprises a plurality of inlet openings communicating with the chamber;
    a plurality of nozzles which are located at the top element and communicate with the chamber;
    a plurality of evaporators for containing and evaporating the evaporating material, wherein each of which is positioned below the body and corresponds to one of the inlet openings respectively, and has an opening through which the evaporator communicates with the corresponding inlet opening; and
    a plurality of connecting pipes configured to connect the opening of the evaporators with the inlet openings of the body, wherein, the connecting pipes are tapered pipes with a broad top and a narrow bottom so as to improve the vapor pressure of the evaporating material in the body to reach pressure balance.

2. The evaporation source assembly of claim 1, wherein the evaporators are crucibles.

3. The evaporation source assembly of claim 1, wherein the evaporation source assembly is a multi-point-type liner evaporation source assembly, and the body is elongated.

4. The evaporation source assembly of claim 1, further comprising heating devices which are provided at the bottom or surrounding of the evaporators for heating the evaporators.

5. The evaporation source assembly of claim 4, wherein the heating devices are independent heating devices for heating each evaporator to different temperature.

6. The evaporation source assembly of claim 5, wherein the evaporators at two ends of the body are heated by the heating devices to a higher temperature than that adjacent to the center of the body.

7. The evaporation source assembly of claim 4, wherein the heating devices are temperature compensator devices.

8. The evaporation source assembly of claim 1, wherein the length of the body is smaller than the length of the substrate.

9. The evaporation source assembly of claim 8, wherein the length of the body is ½-⅘ of the length of the substrate.

10. The evaporation source assembly of claim 1, wherein the nozzles are nozzle tubes which are independently formed in the top element, or through holes formed in the top element.

11. The evaporation source assembly of claim 1, wherein the top element and side walls are integrative or separable.

12. The evaporation source assembly of claim 1, wherein an angle between the surface of the top element and the axis of the nozzle at the center of the top element is 90°.

13. The evaporation source assembly of claim 1, wherein angles between the surface of the top element and the axes of the nozzles at two ends of the top element are smaller than 90°, and the axes of the nozzles are inclined towards corresponding end of the top element.

14. The evaporation source assembly of claim 13, wherein the angles between the surface of the top element and the axes of the nozzles gradually become smaller with the nozzles away from the center of the top element.

15. The evaporation source assembly of claim 1, wherein the diameters of the nozzles gradually become larger with the nozzles away from the center of the top element.

16. The evaporation source assembly of claim 1, wherein the arrangement densities of the nozzles gradually become larger with the nozzles away from the center of the top element.

17. The evaporation source assembly of claim 1, wherein the nozzle openings of the nozzles are in collinear or interlaced arrangement.

18. The evaporation source assembly of claim 1, wherein the body and the connecting pipes are made from galvanized iron or Titanium.

19. The evaporation source assembly of claim 1, further comprising:
    a three-way valve which has a first way communicating with the evaporators, a second way communicating with the chamber of the body, and a third way;
    an exhaust pipe, one end of the exhaust pipe communicating with the third way of the three-way valve;
    a gas collecting box configured to communicate with the other end of the exhaust pipe;
    wherein in the working condition of the evaporation source assembly, the first and second ways are open, and the third way is closed; in the nonworking condition of the evaporation source assembly, the first and second ways are closed, and the third way is open.

20. A film deposition device, which comprises a vacuum chamber and an evaporation source assembly provided in the vacuum chamber, wherein the evaporation source assembly is used to deposit a film on a substrate, the evaporation source assembly comprises:
    a body which comprises a top element, a bottom element and side walls which define a hollow chamber together, the bottom element comprising a plurality of inlet openings communicating with the chamber;
    a plurality of nozzles which are located at the top element and communicate with the chamber;
    a plurality of evaporators for containing and evaporating the evaporating material, each of which being positioned below the body and corresponding to one of the inlet openings respectively, and having an opening through which the evaporator communicates with the corresponding inlet opening; and
    a plurality of connecting pipes configured to connect the opening of the evaporators with the inlet openings of the body, the connecting pipes being tapered pipes with a broad top and a narrow bottom so as to improve the vapor pressure of the evaporating material in the body to reach pressure balance.

21. The film deposition device according to claim 20, wherein the evaporation source assembly further comprises heating devices which are provided at the bottom or surrounding of the evaporators for heating the evaporators, and the heating devices are independent heating devices for heating each evaporator to different temperature.

22. The film deposition device according to claim 21, wherein the evaporators at two ends of the body are heated by the heating devices to a higher temperature than that adjacent to the center of the body.

23. The film deposition device according to claim 21, wherein the heating devices are temperature compensator devices.

24. The film deposition device according to claim 20, wherein angles between the surface of the top element and the axes of the nozzles at two ends of the top element are smaller than 90°, the axes of the nozzles are inclined towards corresponding end of the top element, and the angles θ between the surface of the top element and the axes of the nozzles gradually become smaller with the nozzles away from the center of the top element.

25. The film deposition device according to claim 20, wherein the nozzle openings of the nozzles are in collinear or interlaced arrangement.

26. The film deposition device according to claim 20, wherein the evaporation source assembly further comprises:
- a three-way valve which has a first way communicating with the evaporators, a second way communicating with the chamber of the body, and a third way;
- an exhaust pipe, one end of the exhaust pipe communicating with the third way of the three-way valve;
- a gas collecting box configured to communicate with the other end of the exhaust pipe;
- in the working condition of the evaporation source assembly the first and second ways being open and the third way being closed; and in the nonworking condition of the evaporation source assembly the first and second ways being closed, and the third way being open.

* * * * *